(12) United States Patent
Lutich

(10) Patent No.: US 9,754,068 B2
(45) Date of Patent: Sep. 5, 2017

(54) METHOD, COMPUTER READABLE STORAGE MEDIUM AND COMPUTER SYSTEM FOR CREATING A LAYOUT OF A PHOTOMASK

(71) Applicant: GLOBALFOUNDRIES Inc., Grand Cayman (KY)

(72) Inventor: Andrey Lutich, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 170 days.

(21) Appl. No.: 14/684,782

(22) Filed: Apr. 13, 2015

(65) Prior Publication Data
US 2016/0162623 A1 Jun. 9, 2016

Related U.S. Application Data

(60) Provisional application No. 62/089,681, filed on Dec. 9, 2014.

(51) Int. Cl.
*G06F 17/50* (2006.01)
*G03F 1/36* (2012.01)

(52) U.S. Cl.
CPC ............ *G06F 17/5081* (2013.01); *G03F 1/36* (2013.01)

(58) Field of Classification Search
USPC .......................................................... 716/51
See application file for complete search history.

(56) References Cited

U.S. PATENT DOCUMENTS

| 8,037,429 B2 | 10/2011 | Shang et al. |
| 8,732,625 B2 | 5/2014 | Ye et al. |
| 2007/0128526 A1* | 6/2007 | Wallace ................. G03F 1/144 430/5 |
| 2011/0065028 A1* | 3/2011 | Kodera ................... G03F 1/144 430/5 |

OTHER PUBLICATIONS

Jayaram et al., "Model-based SRAF Solutions for Advanced Technology Nodes," Proc. of SPIE, vol. 8886, 88860P, 2013.
Villaret et al., "Inverse Lithography Technique for advanced CMOS nodes," Proc. of SPIE, vol. 8683, 86830E, 2013.

* cited by examiner

*Primary Examiner* — Bryce Aisaka
(74) *Attorney, Agent, or Firm* — Amerson Law Firm, PLLC

(57) ABSTRACT

A method includes providing a layout of a portion of a photomask. The layout includes a plurality of target features having a shape in accordance with a corresponding one of a target shape. For each of the target shapes, a local map specifying a respective value of a local sub-resolution assist feature (SRAF) usefulness for each of a plurality of positions relative to the target shape is provided. For each of the target features, an assignment of a part of the values of the local SRAF usefulness of the local map for the target shape corresponding to a target feature to a position relative to the portion of the photomask is provided. A global map specifying a global SRAF usefulness for each of the positions relative to the portion of the photomask is provided on the basis of the assignment of the values of the local SRAF usefulness.

15 Claims, 11 Drawing Sheets

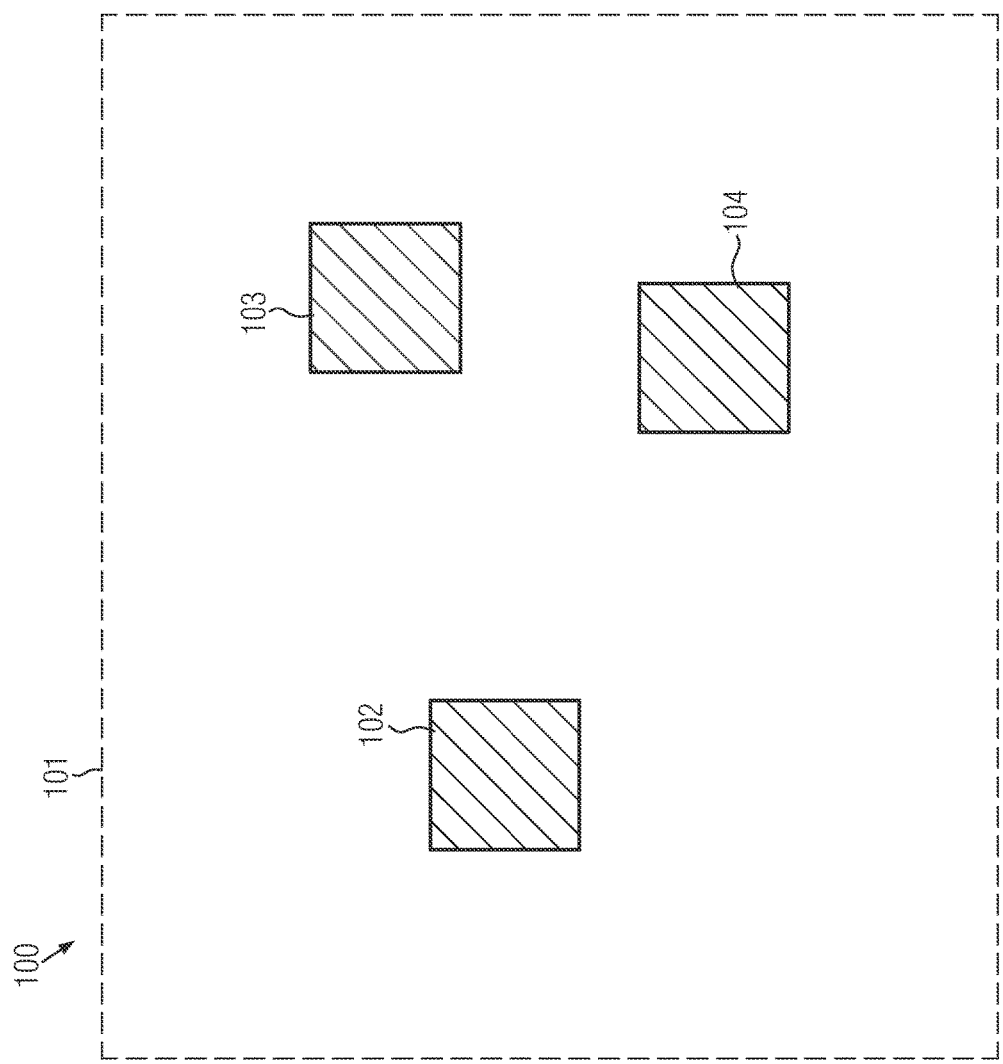

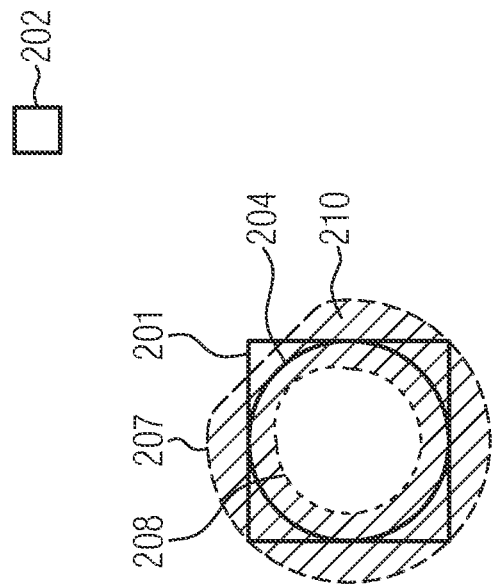
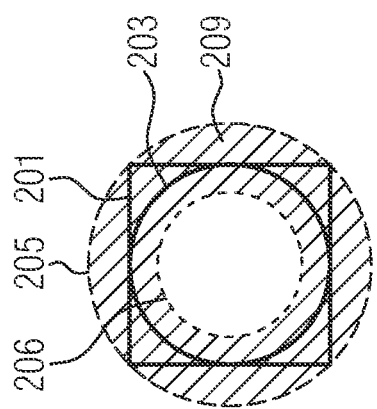
FIG. 2b
FIG. 2a

METHOD, COMPUTER READABLE STORAGE MEDIUM AND COMPUTER SYSTEM FOR CREATING A LAYOUT OF A PHOTOMASK

BACKGROUND OF THE INVENTION

1. Field of the Invention

Generally, the present disclosure relates to the manufacturing of integrated circuits, and, in particular, to the creation of photomasks for use in photolithographic processes.

2. Description of the Related Art

Integrated circuits typically include a large number of circuit elements which include, in particular, field effect transistors. Other types of circuit elements which may be present in integrated circuits include capacitors, diodes and resistors. The circuit elements in an integrated circuit may be electrically connected by means of electrically conductive metal lines formed in a dielectric material, for example by means of damascene techniques. The electrically conductive metal lines may be provided in a plurality of interconnect layers that are stacked on top of each other above a substrate in and on which the circuit elements are formed. Metal lines in different interconnect layers may be electrically connected with each other by means of contact vias that are filled with metal.

Due to the complexity of modern integrated circuits, in the design of integrated circuits, automated design techniques are typically employed.

The design of an integrated circuit can employ a number of steps. These steps may include the creation of a user specification that defines the functionality of the integrated circuit. The user specification may be the basis for the creation of a register transfer level description that models the integrated circuit in terms of a flow of signals between hardware registers and logical operations performed on those signals. The register transfer level description of the integrated circuit can then be used for the physical design of the integrated circuit, wherein a layout of the integrated circuit is created. The thus-created layout may be the basis for the formation of photomasks that may be employed for patterning materials in the manufacturing of the integrated circuit by means of photolithography processes.

In a photolithography process, a photomask is projected to a layer of a photoresist that is provided over a semiconductor structure. Portions of the photoresist are irradiated with radiation that is used for projecting the photomask to the photoresist. Other portions of the photoresist are not irradiated, wherein the pattern of irradiated portions of the photoresist and portions of the photoresist that are not irradiated depends on a pattern of printing features provided on the photomask.

Thereafter, the photoresist can be developed. Depending on whether a negative or a positive photoresist is used, in the development process, either the non-irradiated portions or the irradiated portions of the photoresist are dissolved in a developer and, thus, removed from the semiconductor structure.

Thereafter, processes for patterning the semiconductor structure, which, in particular, may include one or more etch processes, may be performed, using the portions of the photoresist remaining on the semiconductor structure as a photoresist mask. Thus, features in accordance with the created layout of the integrated circuit may be formed on the semiconductor structure.

In the formation of small features in semiconductor structures, resolution enhancement techniques may be employed, wherein so-called sub-resolution assist features (SRAFs) are provided on a photomask, in addition to printing features which are employed for forming photoresist features. SRAFs may be provided in the form of small features which may, for example, have a bar shape and which are provided on the photomask in the vicinity of the printing features. When the photomask is used in a photolithography process, typically no features corresponding to the SRAFs are formed in the photoresist mask that is provided on the semiconductor structure. However, the presence of SRAFs can reduce a sensitivity of the photolithography process with respect to variations of parameters of the photolithography process, which may include, in particular, a focus of the projection and a dose of the radiation used for projecting the photomask to the photoresist.

Techniques for placing SRAFs in the layout of a photomask include rule-based SRAF generation methods. Rule-based SRAF generation methods can be fast, in terms of a computation time required for determining the placement of SRAFs, but they are typically not generic and can require significant engineering efforts to set up and maintain a set of rules, which are denoted as "recipes." Other techniques for SRAF placement include model-based methods, which can provide a higher SRAF quality at a lower recipe complexity. However, model-based methods typically require a longer run time of algorithms employed for the placement of SRAFs.

Model-based methods for SRAF placement can be split into major groups. In a first group of methods, an aerial image simulation with further processing to seed a growth and/or an insertion of manufacturable SRAFs can be employed. In a second group of methods, exact mask layout solutions can be determined by means of inverse lithographic technology, where mask shapes are generated from a target photoresist pattern through an optimization of a pixel-based function over a whole area on the basis of a model representing the photolithography system from the radiation source to the photoresist. The mask solutions given by the inverse lithographic technology can then be converted to SRAF shapes according to mask rule check constraints provided by a photomask manufacturer.

U.S. Pat. No. 8,732,625 discloses methods for creating model-based SRAFs. An SRAF guidance map is created, wherein each design target edge location votes for a given field point on whether a single-pixel SRAF placed on this field point would improve or degrade the aerial image over the process window. The SRAF guidance map can be used to determine SRAF placement rules and/or to fine-tune already-placed SRAFs.

U.S. Pat. No. 8,037,429 discloses a system for producing mask layout data that retrieves target layout data defining a pattern of features, or a portion thereof, and an optimized mask layout pattern that includes a number of printing and non-printing features. Mask layout data for one or more SRAFs is then defined to approximate one or more non-printing features of the optimized mask layout pattern.

Jayaram et al., "Model-based SRAF Solutions for Advanced Technology Nodes," 29th European Mask and Lithography Conference. Proc. of SPIE Vol. 8886, 88860P, 2013, discloses model-based SRAF placement techniques.

Villaret et al., "Inverse Lithography Technique for advanced CMOS Nodes," Optical Microlithography XXVI, Proc. of SPIE Vol. 8683, 86830E, 2013, discloses inverse lithography techniques.

While inverse lithography techniques can provide a higher quality of SRAF placement than other known model-based techniques or rule-based techniques for SRAF placement, it can require a relatively large amount of computing time, which can limit the applicability of inverse lithography techniques to the placement of SRAFs in small portions of a photomask that include only a small fraction of the printing features employed in the formation of a photomask for a full chip.

In view of the above-described situation, the present disclosure provides methods, computer readable storage media and computer systems which can provide a high quality of SRAF placement while being fast enough to be used for full-chip runs.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a layout of at least a portion of a photomask. The layout includes a plurality of target features. Each target feature has a shape in accordance with a corresponding one of at least one target shape. For each of the at least one target shape, a local map specifying a respective value of a local sub-resolution assist feature (SRAF) usefulness for each of a plurality of positions relative to the target shape is provided. For each of the plurality of target features, an assignment of each of at least a part of the values of the local SRAF usefulness of the local map for the target shape corresponding to a target feature to a respective one of a plurality of positions relative to the at least a portion of the photomask is provided. A global map specifying a respective global SRAF usefulness for each of the plurality of positions relative to the at least a portion of the photomask is provided on the basis of the assignment of the values of the local SRAF usefulness.

An illustrative computer readable storage medium disclosed herein including code for causing a computer to: receive a layout of at least a portion of a photomask, the layout including a plurality of target features, each target feature having a shape in accordance with a corresponding one of at least one target shape; for each of the at least one target shape, provide a local map specifying a respective value of a local sub-resolution assist feature (SRAF) usefulness for each of a plurality of positions relative to the target shape; for each of the plurality of target features, provide an assignment of each of at least a part of the values of the local SRAF usefulness of the local map for the target shape corresponding to the target feature to a respective one of a plurality of positions relative to the at least a portion of the photomask; and provide a global map specifying a respective global SRAF usefulness for each of the plurality of positions relative to the at least a portion of the photomask on the basis of the assignment of the values of the local SRAF usefulness.

An illustrative computer system disclosed herein includes: means for receiving a layout of at least a portion of a photomask, the layout including a plurality of target features, each target feature having a shape in accordance with a corresponding one of at least one target shape; means for providing, for each of the at least one target shape, a local map specifying a respective value of a local sub-resolution assist feature (SRAF) usefulness for each of a plurality of positions relative to the target shape; means for providing, for each of the plurality of target features, an assignment of each of at least a part of the values of the local SRAF usefulness of the local map for the target shape corresponding to the target feature to one of a plurality of positions relative to the at least a portion of a photomask; and means for providing a global map specifying a respective global SRAF usefulness for each of the plurality of positions relative to the at least a portion of the photomask on the basis of the assignment of the values of the local SRAF usefulness.

Another illustrative computer system disclosed herein includes a memory, a local map calculator, a local SRAF usefulness assigner and a global map calculator. The memory stores a layout of a photomask. The layout includes a plurality of target features. Each target feature has a shape in accordance with a corresponding one of at least one target shape. The local map calculator provides, for each of the at least one target shape, a local map specifying a respective value of a local sub-resolution assist feature (SRAF) usefulness for each of a plurality of positions relative to the target shape. The local SRAF usefulness assigner provides, for each of the plurality of target features, an assignment of each of at least a part of the values of the local SRAF usefulness of the local map for the target shape corresponding to the target feature to a respective one of a plurality of positions relative to the at least a portion of a photomask. The global map calculator provides a global map specifying a respective global SRAF usefulness for each of the plurality of positions relative to the at least a portion of the photomask on the basis of the assignment of the values of the local SRAF usefulness.

Another illustrative method disclosed herein includes providing a layout of at least a portion of a photomask. The layout includes a plurality of target features. Each target feature has a shape in accordance with a corresponding one of at least one target shape. For each of the at least one target shape, a local map specifying a respective value of a local sub-resolution assist feature (SRAF) usefulness for each of a plurality of positions relative to a target shape is provided. The local SRAF usefulness for a position relative to the target shape is a quantity that is indicative of a change of a process window obtainable in a lithography process, wherein a photoresist is patterned with only the target shape by placing an SRAF element at the position relative to the target shape. For each of the plurality of target features, an assignment of each of at least a part of the values of the local SRAF usefulness of the local map for the target shape corresponding to the target feature to a respective one of a plurality of positions relative to the at least a portion of a photomask is provided. A global map specifying a respective SRAF usefulness for each of the plurality of positions relative to the at least a portion of the photomask is provided on the basis of the assignment of the values of the local SRAF usefulness. Providing the local map includes calculating, for each of the plurality of positions relative to the at least a portion of the photomask, a sum of the values of the local SRAF usefulness assigned to the respective position relative to the at least a portion of the photomask. One or more SRAFs are placed in the layout on the basis of the global map. A photomask including the plurality of target features and the one or more SRAFs is manufactured.

BRIEF DESCRIPTION OF THE DRAWINGS

The disclosure may be understood by reference to the following description taken in conjunction with the accompanying drawings, in which like reference numerals identify like elements, and in which:

FIG. 1 shows a schematic view illustrating a layout of a portion of a photomask;

FIGS. 2A and 2B show schematic views of a target shape and contours of a simulated photoresist feature;

Figure 3:
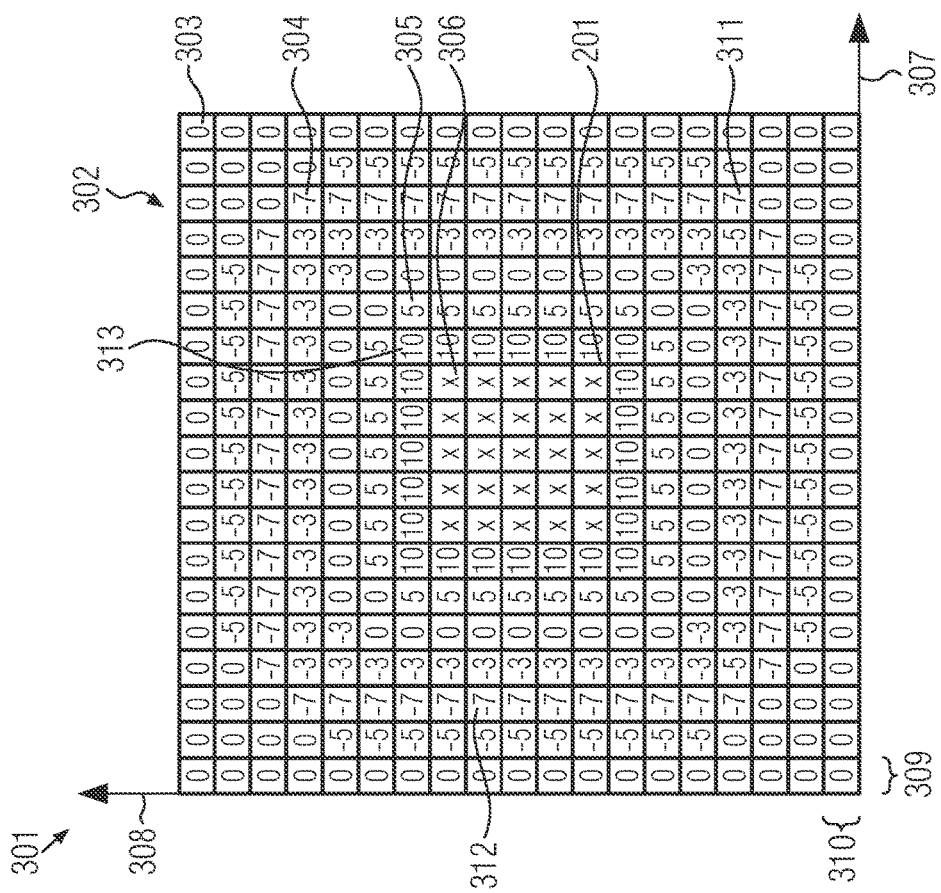
FIG. 3 schematically illustrates a local map of a local SRAF usefulness.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Embodiments disclosed herein are based on the idea that an ideal placement of sub-resolution resist features (SRAFs) for individual target shapes can be known before SRAF insertion on a complex combination of target features having shapes in accordance with the target shapes starts. The proximity of a single isolated target shape can be characterized by an SRAF usefulness map. This map depicts the effect of placing an elementary SRAF on a given spot close to the target shape.

When SRAFs need to be generated on a complex pattern of target features, each target feature having a shape in accordance with a target shape, a global SRAF usefulness can be calculated in the space between the target features as a sum of usefulness contributions from the individual target features. As the local usefulness for individual target shapes can be both positive and negative, the global usefulness can be evaluated to justify whether placing an SRAF on a particular spot will have an overall positive or negative effect.

While, in some embodiments, a linear addition of the contributions of the individual target features to the global usefulness can be performed, in other embodiments, more complex ways of deriving the global usefulness could be applied, for example to favor smaller SRAFs or SRAFs classified by another tag. For example, the calculation of the global SRAF usefulness can include a weighted addition of the contributions of the individual target features. In some embodiments, the contribution of each target feature can be weighted inversely proportional to an area of the target feature. Alternatively, different weights can be individually assigned to different shapes.

After the creation of the global SRAF usefulness map, a threshold can be applied to select areas with the most net positive effect from SRAF insertion on these spots. Generated contours enclosing areas with net positive effect of SRAF insertion can either be used as a guideline for insertion of manufacturable SRAFs or directly converted to shapes fulfilling the mask rule compliance checks of a photomask manufacturer.

FIG. 1 shows a schematic view of a layout 100 of a portion 101 of a photomask. The portion 101 of the photomask 100 includes target features 102, 103, 104. Each of the target features 102, 103, 104 can define a printing feature on a photomask that corresponds to a photoresist feature that is to be formed on a surface of a semiconductor structure in a semiconductor manufacturing process. In the following, embodiments wherein SRAFs for the portion 101 of a photomask are provided will be described. However, the techniques described herein can also be used for providing SRAFs to a photomask that defines features of a complete chip to be formed on a semiconductor structure.

The layout 100 can be provided in form of layout data that can be provided by means of automatic design techniques for the design of integrated circuits as described above. The layout data can specify shapes of the target features 102, 103, 104 and positions of the target features 102, 103, 104. The positions of the target features 102, 103, 104 can be specified relative to the portion 101 of the photomask which, in some embodiments, can represent a complete photomask.

Each of the target features 102, 103, 104 can have a shape in accordance with at least one target shape. In FIGS. 2A and 2B, an exemplary rectangular target shape is denoted by reference numeral 201. In some embodiments, each of the target features 102, 103, 104 can have a shape in accordance with a single target shape, which can, for example, be a rectangular shape with predetermined values of the lengths of the sides of the rectangle. In other embodiments, the layout 100 can include target features of different shapes so that each of the targets features has a shape in accordance with a corresponding one of a plurality of target shapes. The number of target shapes can be substantially smaller than the number of target features in the layout 100 so that, for each target shape, there is a plurality of target features having a shape in accordance with the respective target shape. In further embodiments, a hierarchical handling can be employed, wherein arrangements of target features corresponding to a particular arrangement of target shapes that occur frequently are treated as single target shape.

Figure 8:
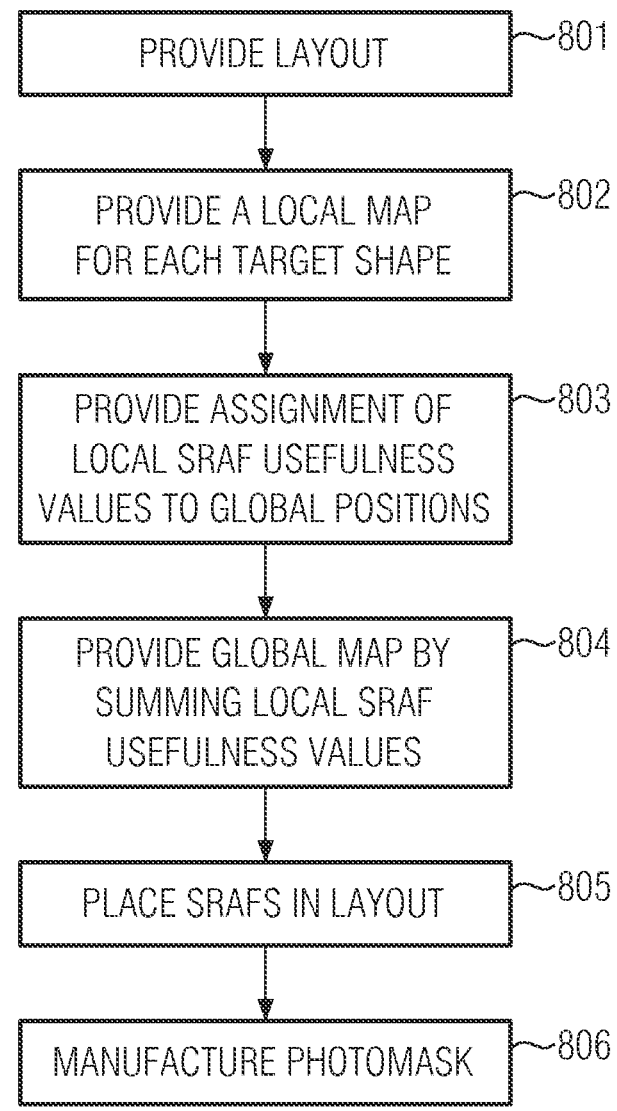
FIGS. 8 to 10 show schematic flow diagrams illustrating methods according to embodiments.
Figure 9:
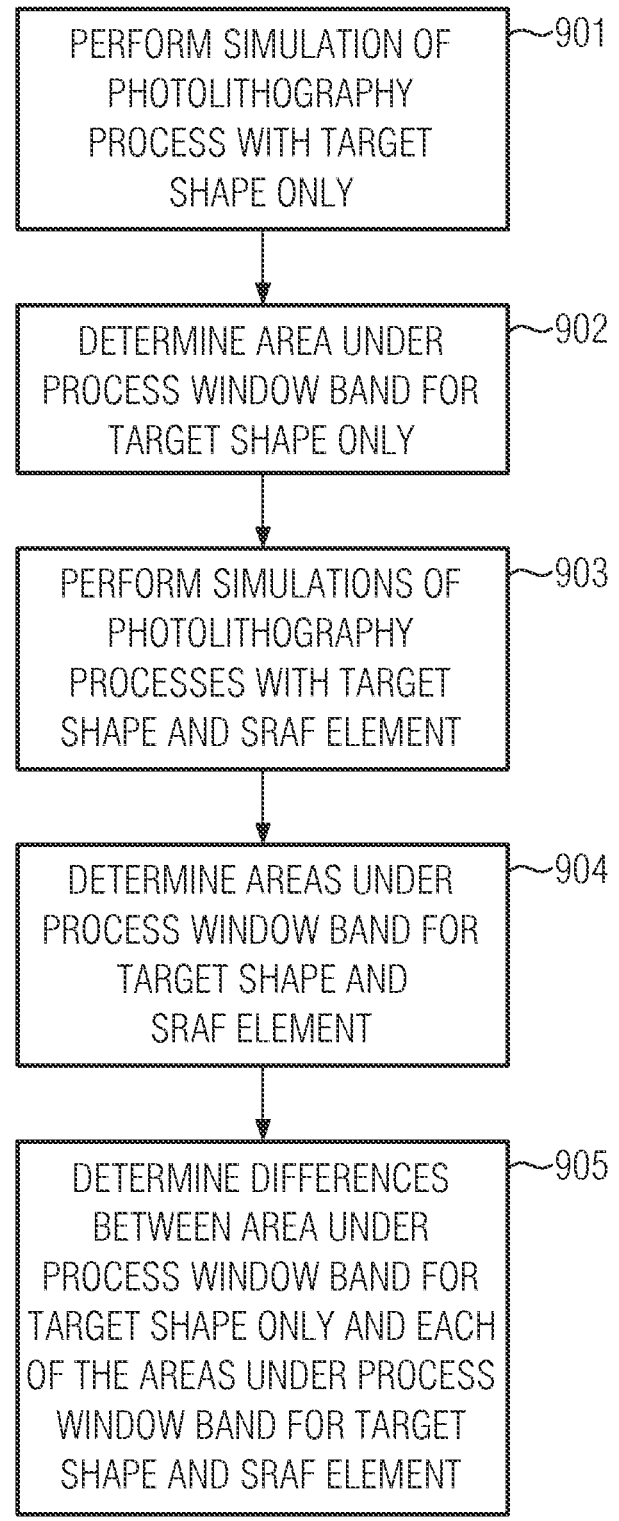
Figure 10:
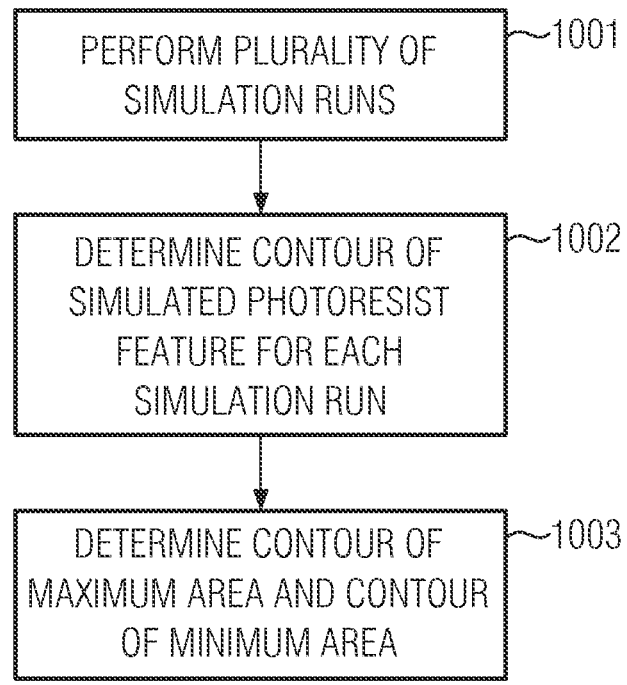

The layout 100 described above with reference to FIG. 1 can be provided and processed further in methods according to embodiments described herein. In the following description of methods according to embodiments, reference will be made to FIGS. 8, 9 and 10. FIG. 8 shows a general flow diagram of a method according to an embodiment, and FIGS. 9 and 10 show sub-steps of the method steps illustrated in FIG. 8.

At 801, the layout 100 described above with reference to FIG. 1 is provided. This can be done by providing layout data defining the layout to a computer system 1100 used for performing the method, which will be described below with reference to FIG. 11. The layout data can be provided via a network connection in a computer network, by means of a storage medium such as, for example, a hard disk, an optical disk and/or a solid state storage medium, or by performing known automatic design techniques by means of the computer system 1100 itself.

At 802, a local map is provided for each of the target shapes.

FIG. 3 schematically illustrates a local map 301 for the target shape 201 shown in FIGS. 2A and 2B. The local map 301 specifies a respective value of a local SRAF usefulness for each of a plurality of positions relative to the target shape 201. Each of the positions relative to the target shape 201 can correspond to a cell of a local grid 302. In FIG. 3, reference numerals 307, 308 denote coordinate axes of a local coordinate system for the target shape 201. The cells of the local grid 302 have a grid spacing 309 along the coordinate axis 307 and a grid spacing 310 along the coordinate axis 308. In some embodiments, the grid spacings 309, 310 can be substantially equal so that the cells of the local grid 302 have a substantially square shape. In other embodiments, the grid spacings 309, 310 can be different so that the cells of the local grid 302 have a rectangular shape.

Positions relative to the target shape 201 corresponding to the cells of the local grid 302 can correspond to positions of elements of the cells of the local grid 302, for example the centers of the cells, in the local coordinate system defined by the coordinate axes 307, 308. An origin of the local coordinate system can be provided at a predetermined spatial relationship to the target shape 201.

In FIG. 3, cells of the local grid 302 within the target shape 201 have been marked with an "x." Reference numeral 306 exemplarily denotes one of the cells of the grid 302 within the target shape 201. The target shape 201 can be provided at the center of the local grid 302, and the origin of the local coordinate system defined by the coordinate axes 307, 308 can be in one of the corners of the local grid 302, for example in the lower left corner, as shown in FIG. 3. Alternatively, the origin of the local coordinate system could be provided, for example, at the center of the target shape 201.

In FIG. 3, values of the local SRAF usefulness are indicated by numbers in cells of the local grid 302. The local SRAF usefulness for a position relative to the target shape 201 can be a quantity that is indicative of a change of a process window that is obtainable in a photolithography process wherein a photoresist is patterned with only the target shape 201 by placing an SRAF element at the position relative to the target shape 201. Since SRAFs are positioned outside the target shape 201, no values of the local SRAF usefulness need to be specified for cells of the local grid 302 that correspond to positions within the target shape 201.

In the embodiment illustrated in FIG. 3, negative values of the local SRAF usefulness correspond to a reduction of the process window, and positive values of the local SRAF usefulness correspond to an increase of the process window. Since a reduction of the process window can improve a stability of the photolithography process with respect to fluctuations of parameters of the photolithography process, such as focus and/or dose, it can be favorable to place an SRAF element at a position relative to the target shape 201 represented by a cell of the local grid 302 having a negative value of the local SRAF usefulness. To the contrary, placing an SRAF element at a position relative to the target shape 201 represented by a cell of the local grid 302 having a positive value of the local SRAF usefulness can adversely affect the stability of the photolithography process with respect to variations of focus and/or dose. Placing an SRAF element at a position relative to the target shape 201 that is represented by a cell of the local grid 302 having a value of 0 of the SRAF usefulness can have substantially no influence on the stability of the photolithography process and/or only a relatively small influence.

In FIG. 3, reference numeral 305 exemplarily denotes one of the cells of the local grid 302 that have a positive value of the global SRAF usefulness, reference numeral 304 exemplarily denotes a cell having a negative value of the local SRAF usefulness, and reference numeral 303 exemplarily denotes a cell of the local grid 302 having a value of the local SRAF usefulness of 0.

As can be seen from FIG. 3, cells of the local grid 302 which are close to the target shape 201 have positive values of the local SRAF usefulness, and cells of the local grid in a ring-shaped region around the target shape 201 have negative values of the local SRAF usefulness. Other cells of the local grid 302 have values of the local SRAF usefulness of 0. Thus, placing an SRAF in the ring-shaped region around the target shape 201 can advantageously reduce a process window of a photolithography process wherein a photoresist is patterned with only the target shape 201.

In the following, techniques that can be used for providing the local map 301 will be described with reference to FIG. 9. At 901, a simulation of a photolithography process wherein a photoresist is patterned with only the target shape 201 in the absence of an SRAF element is performed. This can be done by means of known techniques for the simulation of photolithography processes. In such techniques, a model of a photolithography system can be provided. The model of the photolithography system can include a light source model that describes properties such as a spectrum and/or coherence properties of electromagnetic radiation that is used for illuminating a photomask, a photomask model that describes an interaction between the electromagnetic radiation and the photomask, an optics model that describes the formation of an aerial image by a projection lens, and a photoresist model that describes a transformation from the aerial image to a photoresist structure.

For simulating a photolithography process wherein the photoresist is patterned with only the target shape 201, a simulation of a photolithography process wherein a photomask is used that includes only a single printing feature having a shape in accordance with the target shape 201 can be performed.

Results of a simulation of a photolithography process wherein the photoresist is patterned only with the target shape 201 are schematically illustrated in FIG. 2A. In FIG. 2A, reference numeral 203 schematically denotes a contour of a photoresist feature that is obtained when parameters of the photolithography process, such as focus and/or dose, are near their optimum values. For convenience, in FIG. 2A, the size of the contour 203 of the photoresist feature has been enlarged by a factor that is inverse to the reduction provided by the projection lens of the photolithography system so that the contour 203 of the photoresist feature can be more easily compared with the target shape 201.

Due to wave properties of the electromagnetic radiation that is used for illuminating the photomask in the photolithography process, and/or due to characteristics of the projection lens and/or the photoresist, the contour 203 of the photoresist feature can be more rounded than the target shape 201.

Further features of the simulation of the photolithography process at 901 will be described with reference to FIG. 10. At 1001, a plurality of simulation runs can be performed. In each of the simulation runs, different values of parameters of the photolithography process, such as focus and dose, that deviate to a certain extent from the optimum values can be used, wherein variations of the parameters between the simulation runs can correspond to fluctuations of the parameters that typically occur in actual photolithography processes.

At 1002, for each of the simulation runs, a contour of a simulated photoresist feature can be determined Since, in the individual simulation runs, the parameters of the photolithography process can deviate from their optimum values, the contours of the simulated photoresist feature that are obtained in the simulation runs can deviate from the contour 203. In some of the simulation runs, the simulated photoresist feature can have a greater extension than the photoresist feature that is obtained when the parameters of the photolithography process are near their optimum values. In other simulation runs, the simulated photoresist feature can have a smaller extension than the photoresist feature that is obtained when the parameters are near their optimum values.

At 1003, among the contours of the simulated photoresist feature obtained in the simulation runs, a contour of maximum area, which is denoted by reference numeral 205 in FIG. 2A, and a contour of minimum area, which is denoted by reference numeral 206 in FIG. 2A, can be determined. An area between the contour 205 and the contour 206, which is denoted as "process window band" is indicated by hatching in FIG. 2A and denoted by reference numeral 209.

Referring to FIG. 9 again, after the simulation of the photolithography process with the target shape only, at 902, an area under the process window band 209 can be determined. The area under the process window band 209 corresponds to a difference between the area enclosed by the contour 205 of maximum area and the area enclosed by the contour 206 of minimum area.

At 903, a plurality of simulations of photolithography processes wherein the photoresist is patterned with the target shape 201 in the presence of an SRAF element can be performed. In some embodiments, a simulation of a photolithography process can be performed for each of the cells of the local grid 302 which are not within the target feature 201. For each cell, a photolithography process can be simulated wherein the photoresist is patterned with the target shape 201 in the presence of an SRAF element at the position relative to the target shape 201 corresponding to the respective cell of the local grid 302.

FIG. 2B shows the target shape 201 and an SRAF element 202 which is exemplarily provided at a position relative to the target shape 201 corresponding to the cell 304 of the local grid 302.

For simulating the photolithography process wherein the photoresist is patterned with the target shape 201 in the presence of the SRAF element 202, a simulation of a photolithography process wherein a photomask having a printing feature corresponding to the target shape 201 and a non-printing feature corresponding to the SRAF element 202 is used can be performed, using techniques as described above with reference to FIG. 10. The SRAF element 202 can have a shape corresponding to the shape of the cells of the local grid 302, for example a rectangular shape having dimensions in accordance with the grid spacings 309, 310 of the local grid 302.

In FIG. 2B, reference numeral 204 denotes a contour of a photoresist feature that is obtained in the photolithography process wherein the photoresist is patterned with the target shape 201 in the presence of the SRAF element 202 when the parameters of the photolithography process are close to their optimum values. Similar to FIG. 2A, the contour 204 has been scaled. The shape of the contour 204 can be similar to the shape of the contour 203 that is obtained in the absence of the SRAF element 202.

Reference numeral 207 denotes a contour of maximum area of the photoresist feature, and reference numeral 208 denotes a contour of minimum area that are obtained in a plurality of simulation runs that are performed for the photolithography process wherein the photoresist is patterned with the target shape 201 and the SRAF element 202. Due to the influence of the SRAF element 202 on the photolithography process, the shape of the contour 207 can be different from the shape of the contour 205, the shape of the contour 208 can be different from the shape of the contour 206, and a process window band 210 between the contours 207, 208 can be different from the process window band 209 that is obtained in the absence of the SRAF element 202. In particular, for SRAF element 202 at the position relative to the target shape 201 corresponding to the cell 304, the process window band 204 can have a smaller area than the process window band 209 that is obtained in the absence of the SRAF element 202.

Referring to FIG. 9 again, at 904, an area under the process window band 210, corresponding to a difference between the area of the contour 207 of a maximum area and the area of the contour 208 of a minimum area is determined for each of the plurality of positions of the SRAF element 202 relative to the target shape 201.

At 905, a difference between the area under the process window band 209 obtained without the SRAF element and the area under the process window band 210 obtained in the presence of the SRAF element 202 is determined for each of a plurality of positions of the SRAF element 202 corresponding to cells of the local grid 302, in particular for positions outside the target shape 201. The determined differences can be provided as values of the local SRAF usefulness for the cells of the local grid 302.

The values of the local usefulness for the cells of the local grid 302 need not be provided as described above. In other embodiments, other parameters that can be determined from simulations as described above can be provided as values of the local SRAF usefulness, for example an area of the contour 208 of minimum area, or a diameter of the contour 207 of maximum area obtained for a position of the SRAF element 202 corresponding to the cell of the local grid 302. In such embodiments, simulations of a photolithography process wherein a photoresist is patterned with only the target shape in the absence of an SRAF element as described above with reference to FIG. 2A can be omitted and only simulations of photolithography process wherein the photoresist is patterned with the target shape 201 in the presence of an SRAF element as described above with reference to FIG. 2B are performed.

In embodiments wherein a plurality of different target shapes are employed, techniques such as described above can be used for providing a local map similar to the local map 301 for each of the target shapes.

Referring to FIG. 8 again, at 803, for each of the target features 102, 103, 104, an assignment of each of the values of the local SRAF usefulness of the local map 301 for the target shape 201 corresponding to the target feature to one of a plurality of positions relative to the portion 101 of the photomask can be provided.

Figure 4:
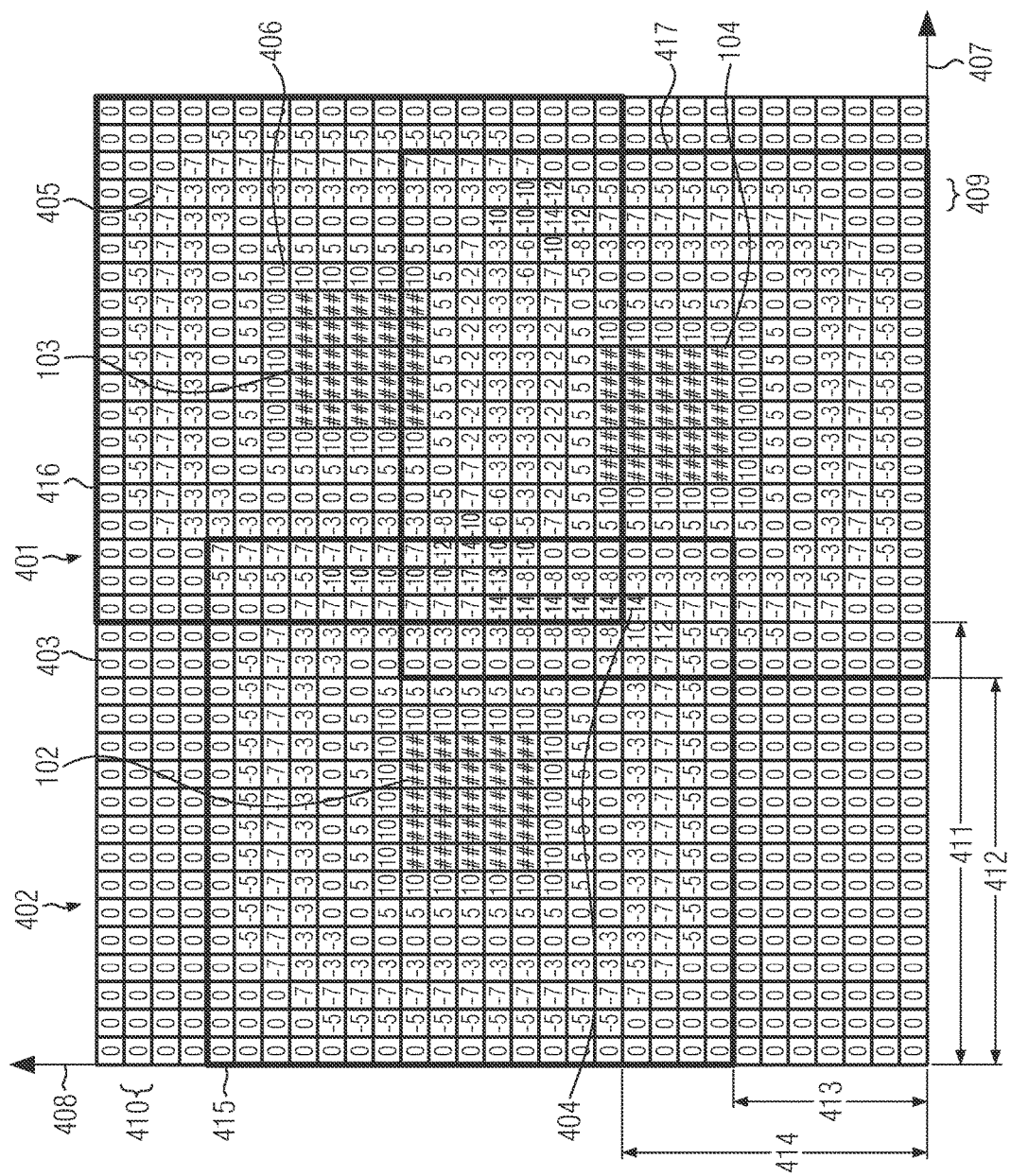
FIG. 4 schematically illustrates a global map of a global SRAF usefulness.

FIG. 4 illustrates a global map 401 that specifies a respective global SRAF usefulness for each of a plurality of positions relative to the portion 101 of the photomask. Each of the plurality of positions relative to the portion 101 of the photomask can correspond to a cell of a regular global grid 402 of positions relative to the portion 101 of the photomask. The global map 401 will be explained in more detail below.

In FIG. 4, reference numerals 407, 408 denote coordinate axes of a global coordinate system wherein positions relative to the portion 101 of the photomask are defined. An origin of the coordinate system defined by the coordinate axes 407, 408 can be provided at a predetermined spatial relationship relative to the portion 101 of the photomask, for example in the lower left corner of the portion 101 of the photomask shown in FIG. 1.

The cells of the global grid 402 can have a grid spacing 409 along the coordinate axis 407 and a grid spacing 410 along the coordinate axis 408. The grid spacing 409 can correspond to the grid spacing 309 of the local grid 302 along the coordinate axis 307, and the grid spacing 410 of the global grid 402 along the coordinate axis 408 can correspond to the grid spacing 310 of the local grid 302 along the coordinate axis 308. Thus, the cells of the local grid 302 and the cells of the global grid 402 have equal dimensions.

In FIG. 4, cells of the global grid 402 within the target features 102, 103, 104 are marked by symbols "##."

For assigning values of the local SRAF usefulness of the local map 302 for the target shape 201 to positions relative to the portion 101 of the photomask corresponding to cells of the global grid 402, an offset between the local grid 302 and the global grid 402 can be determined for each of the target features 102, 103, 104. The offset can be selected such that the cells of the local grid 302 within the target shape 201 overlap the cells of the global grid 402 within the respective target feature when the local grid 302 is shifted relative to the global grid 402 by the offset.

In the example illustrated in FIG. 4, there is an offset of 0 cells in the direction of the coordinate axis 407 and an offset 413 of 7 cells in the direction of the coordinate axis 408 for the target feature 102. Thus, for the target feature 102, the values of the local SRAF usefulness of the cells of the local grid 302 of the local map 301 are assigned to positions relative to the portion 101 of the photomask corresponding to cells of the global grid 402 in an area 415 of the global grid 402.

For the target feature 103, there is an offset 411 of 16 cells in the direction of the coordinate axis 407 and an offset 414 of 11 cells in the direction of the coordinate axis 408 so that the values of the local SRAF usefulness of the cells of the local grid 302 of the local map 301 are assigned to positions relative to the portion 101 of the photomask corresponding to cells of the global grid 402 in an area 416 of the global grid 402.

For the target feature 104, there is an offset 412 of 14 cells in the direction of the coordinate axis 407 and an offset of 0 cells in the direction of the coordinate axis 408 so that the values of the local SRAF usefulness of the cells of the local grid 302 of the local map 301 are assigned to positions relative to the portion 101 of the photomask corresponding to cells of the global grid 402 in an area 417 of the global grid 402.

The areas 415, 416, 417 of the global grid 402 can overlap, as shown in FIG. 4. Thus, there can be positions relative to the portion 101 of the photomask to which a plurality of values of the local SRAF usefulness from the local map 301 is assigned. Furthermore, there can be cells of the global grid 402 to which no values of the local SRAF usefulness from the local map 301 are assigned.

In embodiments wherein a plurality of different target shapes are employed, for each of the target features of the portion 101 of the photomask, values of the local map corresponding to the respective target feature can be assigned to positions relative to the portion 101 of the photomask, for example by providing offsets for the local maps for the target shapes.

Referring to FIG. 8 again, at 804, the global map 401 can be provided, wherein the global map 401 specifies a respective global SRAF usefulness for a plurality of positions relative to the portion 101 of the photomask corresponding to cells of the global grid 402. In FIG. 4, numbers in cells of the global grid 402 representing the values of the global SRAF usefulness of the global map 401 are shown. Cells of the global grid 402 within the target features 102, 103, 104 need not be provided with values of the global SRAF usefulness.

In some embodiments, the values of the global SRAF usefulness for the positions relative to the portion 101 of the photomask corresponding to cells of the global grid 402 can be obtained by summing the values of the local SRAF usefulness assigned to the positions relative to the portion 101 of the photomask corresponding to the cells of the global grid 402. For each of the cells of the global grid 402 that are not within one of the target features 102, 103, 104, a value of the global SRAF usefulness being a sum of the values of the local SRAF usefulness of each of the cells of the local grid 302 assigned to the respective cell of the global grid can be calculated, wherein cells of the global grid 402 outside the areas 415, 416, 417 to which no cells of the local grid 302 were assigned obtain a value of the global SRAF usefulness of 0.

Cells of the global grid 402 that are within a single one of the areas 415, 416, 417 and not within any of the target features 102, 103, 104 obtain a value of the global SRAF usefulness that is equal to the value of the local SRAF usefulness of the cell of the local grid 302 assigned to the respective cell of the global grid 402. Cells of the global grid 402 in portions of the global grid 402 where the areas 415, 416, 417 overlap and which are outside the target features 102, 103, 104 obtain a value of the global SRAF usefulness being a sum of the values of the local SRAF usefulness of two or more cells of the local grid 302 assigned to the respective cell of the global grid 402.

In FIG. 4, reference numeral 403 denotes an exemplary cell of the global grid 402 outside the areas 415, 416, 417 that has a value of the global SRAF usefulness of 0. Reference numeral 404 exemplarily denotes a cell of the global grid 402 in the portion of the global grid 402 where the areas 415, 417 overlap. The cell 404 of the global grid 402 obtains a value of the global SRAF usefulness of −14, being a sum of the values of −7 of the two cells 311, 312 (see FIG. 3) of the local grid 302 that were assigned to the cell 404 of the global grid 402.

Reference numeral 406 exemplarily denotes a cell of the global grid 402 that is within only the area 416 and obtains a value of the global SRAF usefulness of 10 that is equal to the value of the local SRAF usefulness of the cell 313 (see FIG. 3) of the local grid 302 that was assigned to the cell 406 of the global grid 402.

The present disclosure is not limited to embodiments wherein a summation of the values of the local SRAF usefulnesses as described above is performed for obtaining the values of the global SRAF usefulness. In other embodiments, for each of a plurality of positions relative to the portion 101 of the photomask corresponding to cells of the global grid 402, a function of each of the values of the local SRAF usefulness assigned to the respective position relative to the portion 101 of the photomask can be calculated, wherein the function can be a function that is different from the above-described sum of the values of the local SRAF usefulness. For example, the function can include a weighted sum of the values of a local SRAF usefulness that are assigned to the cells of the global grid, as will be detailed below.

Figure 12:
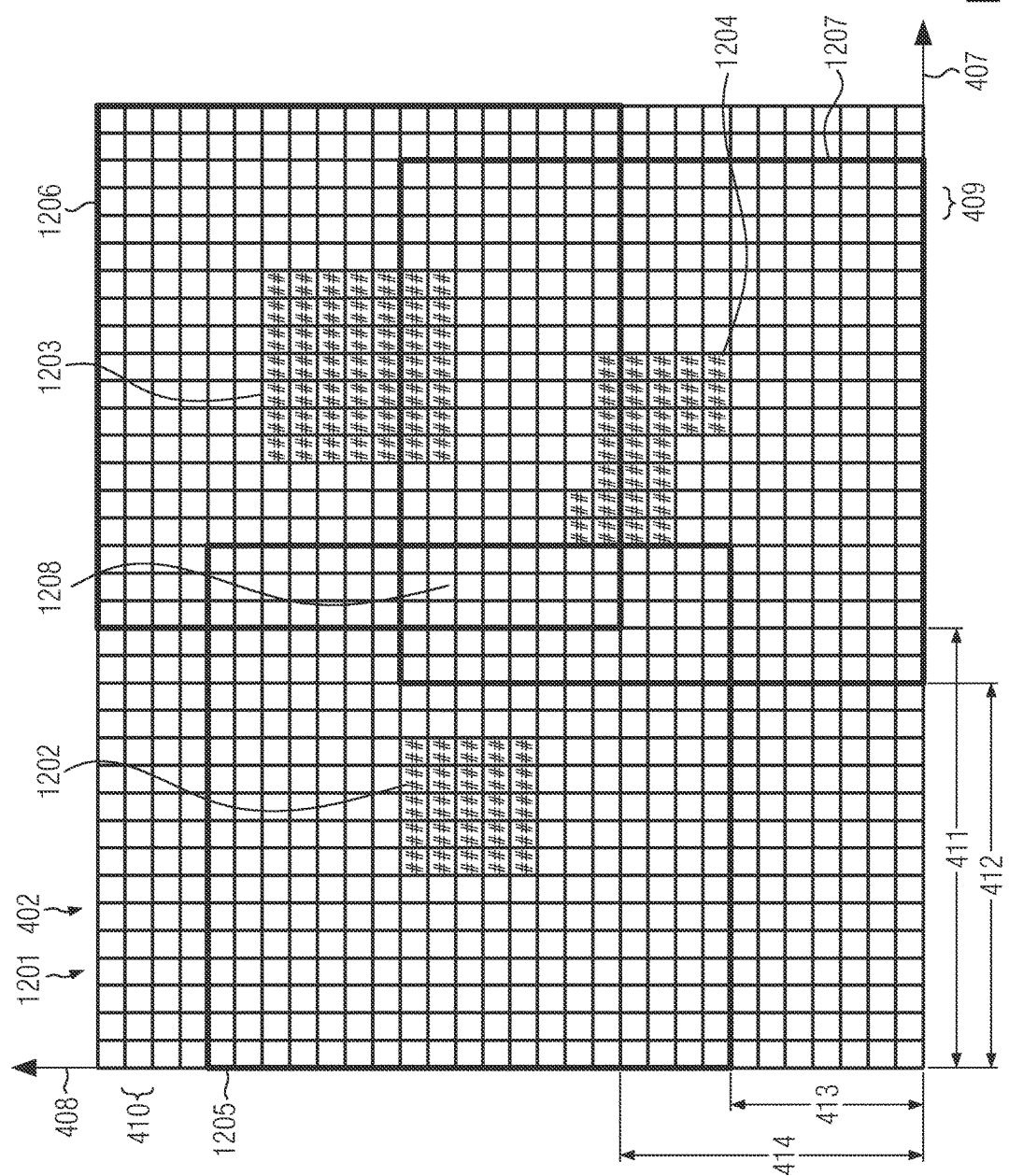
FIG. 12 schematically illustrates a global map of a global SRAF usefulness.

FIG. 12 schematically illustrates a global map 1201 that specifies a respective value of a global SRAF usefulness for each of a plurality of positions relative to a portion of a photomask in an embodiment wherein the portion of the photomask includes target features 1202, 1203, 1204 having shapes that correspond to different target shapes. For convenience, numbers indicating the values of the global SRAF usefulness as shown in FIG. 4 have been omitted in FIG. 12.

For convenience, in FIG. 4 on the one hand, and in FIG. 12 on the other hand, like reference numerals have been used to denote like components. Unless explicitly stated otherwise, components denoted by like reference numerals can have corresponding features, and a detailed description thereof will sometimes be omitted. In particular, the values of the global SRAF usefulness can be provided for positions relative to the portion of the photomask that correspond to cells of a global grid 402, the cells having an extension 409 in a direction of a global coordinate axis 407 and an extension 410 in a direction of a global coordinate axis 408, wherein an origin of the coordinate system defined by the coordinate axes 407, 408 is provided at a predetermined spatial relationship to the portion of the photomask.

The target feature 1202 can have a shape corresponding to the target shape 201 described above with reference to FIGS. 2A, 2B and 3. The values of the local SRAF usefulness provided by the local usefulness map 301 for the target shape 201 can be assigned to an area 1205 of the global grid 402.

The target feature 1203 can have a shape corresponding to a target shape other than the target shape 201 corresponding to the target feature 1202, for example a rectangular shape having a greater area than the target shape 201, and the target feature 1204 can have a shape corresponding to a further target shape that is different from each of the target shapes corresponding to the target features 1202, 1203. The values of the local SRAF usefulness provided by the local usefulness map for the target shape corresponding to the target feature 1203 can be assigned to an area 1206 of the global grid 402. The values of the local SRAF usefulness provided by the local usefulness map for the target shape corresponding to the target feature 1204 can be assigned to an area 1207 of the global grid 402. The assignment of the values of the local SRAF usefulness can be specified by offsets 411, 412, 413, 414 of the local grids of the local maps for the target shapes relative to the global grid 402.

In some embodiments, values of the global SRAF usefulness for cells in portions of the global grid 402 where two or more of the areas 1205, 1206, 1207 overlap can be calculated in accordance with the equation:

$$U_{glob} = \sum_i U_i$$

wherein $U_{glob}$ is the global usefulness for a cell of the global grid 402 and $U_i$ is the value of an i-th one the local SRAF usefulness values from the local maps that were assigned to the position relative to the portion of the photomask corresponding to the cell of the global grid 402. The summation is performed over all local SRAF usefulness values that were assigned to the respective cell of the global grid 402. For example, for cell 1208 of the global grid 402 that is located in an area of overlap of the areas 1205, 1206, 1207, the summation is performed over the three local SRAF usefulness values from the local maps for the target shapes corresponding to the three target features 1202, 1203, 1204. This calculation corresponds to the summation described above with reference to FIG. 4.

In other embodiments, values of the global SRAF usefulness can be calculated in accordance with the equation:

$$U_{glob} = \left(\sum_i A_i\right) \cdot \left(\sum_i \frac{U_i}{A_i}\right)$$

wherein $A_i$ is an area of the target shape providing the value $U_i$ of the local SRAF usefulness for the position relative to the portion of the photomask. Thus, the contributions of the local SRAF usefulnesses to the global SRAF usefulness are weighted inversely proportional to the areas of the target shapes, so that smaller target shapes contribute to the global SRAF usefulness to a greater extent.

In further embodiments, weights can be freely assigned to the target shapes, and the value of the global SRAF usefulness can be calculated in accordance with the equation:

$$U_{glob} = \sum_i S_i \cdot U_i$$

wherein $S_i$ is the weight for the target shape providing the value $U_i$ of the local SRAF usefulness.

Referring to FIG. 8 again, at 805, one or more SRAFs can be placed in the layout 100 on the basis of the global map 401 or 1201, respectively. In the following, embodiments will be described wherein the global map 401 is used. In other embodiments, the global map 1201 can be used instead.

In some embodiments, the placement of the one of more SRAFs can include applying a threshold global SRAF usefulness to the global map 401 and selecting a subset of a plurality of positions relative to the portion 101 of the photomask corresponding to cells of the global grid 402 at which the global SRAF usefulness exceeds the threshold global SRAF usefulness. The threshold global SRAF usefulness can have a negative value, and the subset of the plurality of positions relative to the portion 101 of the photomask can include positions relative to the portion 101 of the photomask wherein the global SRAF usefulness is smaller (i.e., more negative) than the threshold SRAF usefulness. Thus, the subset of the plurality of positions relative to the portion 101 of the photomask includes positions where a placement of an SRAF can be particularly advantageous in view of an improvement of a stability of a photolithography process.

The selection of the positions relative to the portion 101 of the photomask at which the global SRAF usefulness exceeds the threshold global SRAF usefulness can be performed on the basis of the global grid 402 described above with reference to FIG. 4, wherein cells of the global grid 402 having a value of the global SRAF usefulness that exceeds the threshold global SRAF usefulness can be selected.

Figure 5:
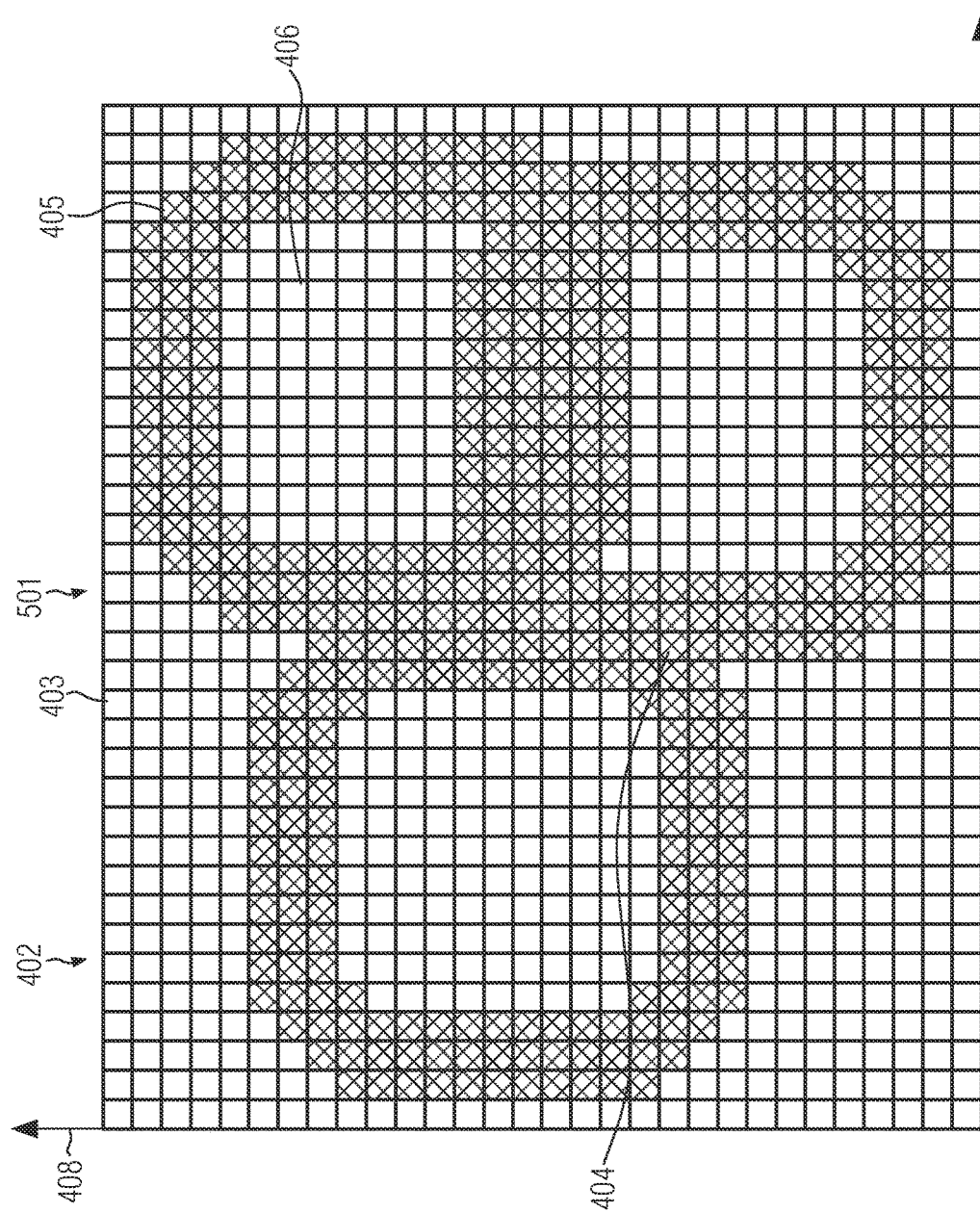
FIG. 5 schematically illustrates positions relative to a portion of a photomask wherein the global SRAF usefulness exceeds a threshold value.

In FIG. 5, the global grid 402 is shown, wherein a subset of the cells of the global grid 402 that represent positions relative to the portion 101 of the photomask wherein the global SRAF usefulness exceeds (is smaller than) a threshold global SRAF usefulness of −0.0006 are indicated by hatching. The subset 501 includes, for example, cell 404, having a value of the global SRAF usefulness of −14 and cell 405, having a value of the global SRAF usefulness of −7. Cell 403, having a value of the global SRAF usefulness of 0 and cell 406, having a value of the global SRAF usefulness of 10 are not included in the subset 501.

In some embodiments, the placement of one or more SRAFs in the layout 100 can include an approximation of the selected subset 501 by means of a plurality of substantially rectangular SRAF elements.

Figure 6:
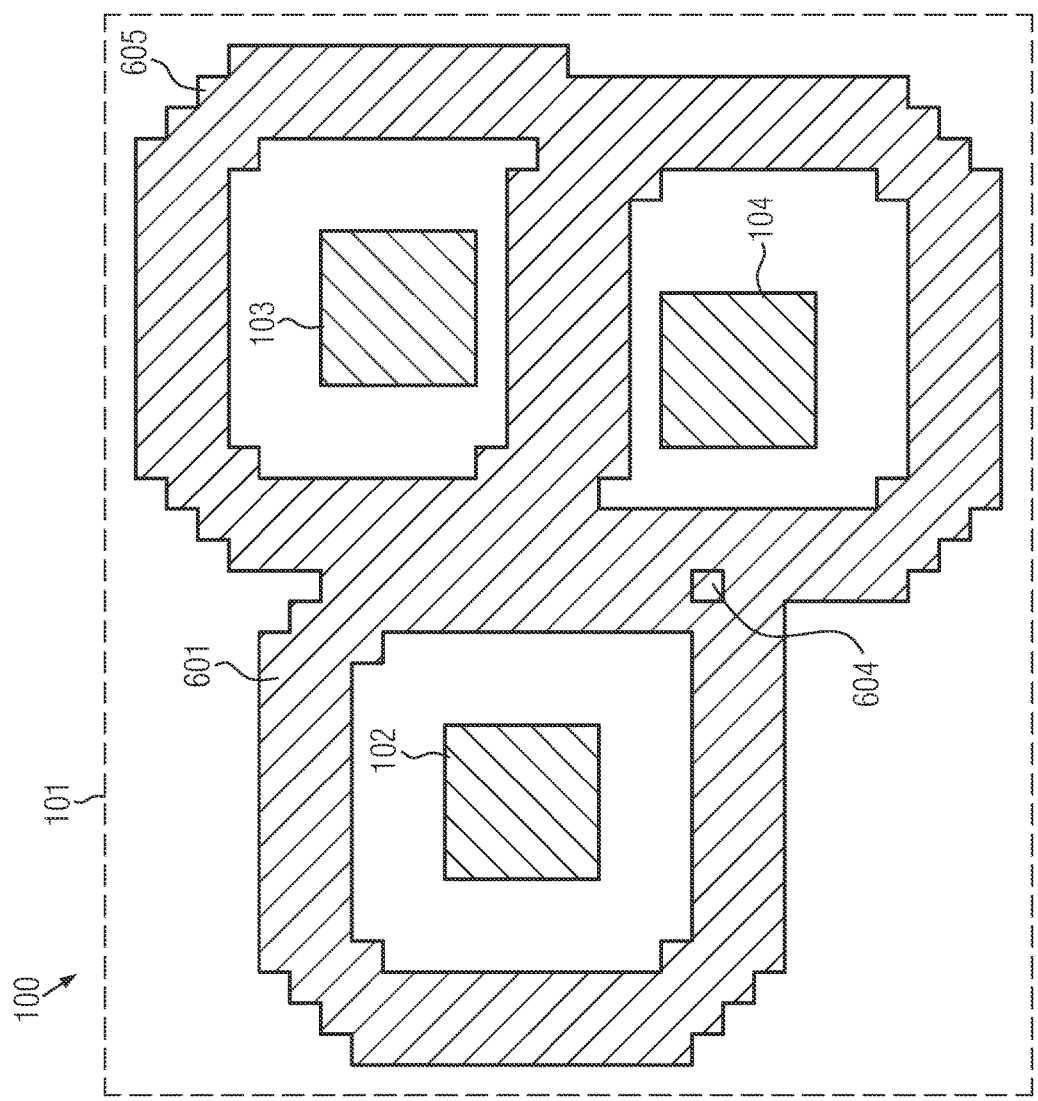
FIG. 6 schematically illustrates a layout of a portion of a photomask with SRAFs inserted.

FIG. 6 shows the layout 100 of the photomask, wherein an SRAF 601 is placed in the portion 101 of the photomask, in addition to the target features 102, 103, 104. The SRAF 601 can be composed of a plurality of SRAF elements that correspond to the cells of the subset 501 of the global grid 402 described above with reference to FIG. 5. In FIG. 6, SRAF elements corresponding to the cells 404, 405 of the global grid 402 are exemplarily denoted by reference numerals 604, 605.

The SRAF 601 need not have a shape that exactly corresponds to the arrangement of the cells in the subset 501 of the global grid 402, as shown in FIG. 6. In other embodiments, the shape of the SRAF element 601 can be modified compared to the subset 501 of the cells of the global grid 402 for optimizing the shape of the SRAF element 601 in view of mask rule compliance requirements. This can be done in accordance with conventional techniques for ensuring mask rule compliance of SRAFs.

In other embodiments, different techniques can be used for placing one or more SRAFs in the layout 100 of the photomask on the basis of the global map 402. In some embodiments, the subset 501 of the cells of the global grid 402 can be used as a guideline for an insertion of one or more SRAFs into the layout 100.

Figure 7:
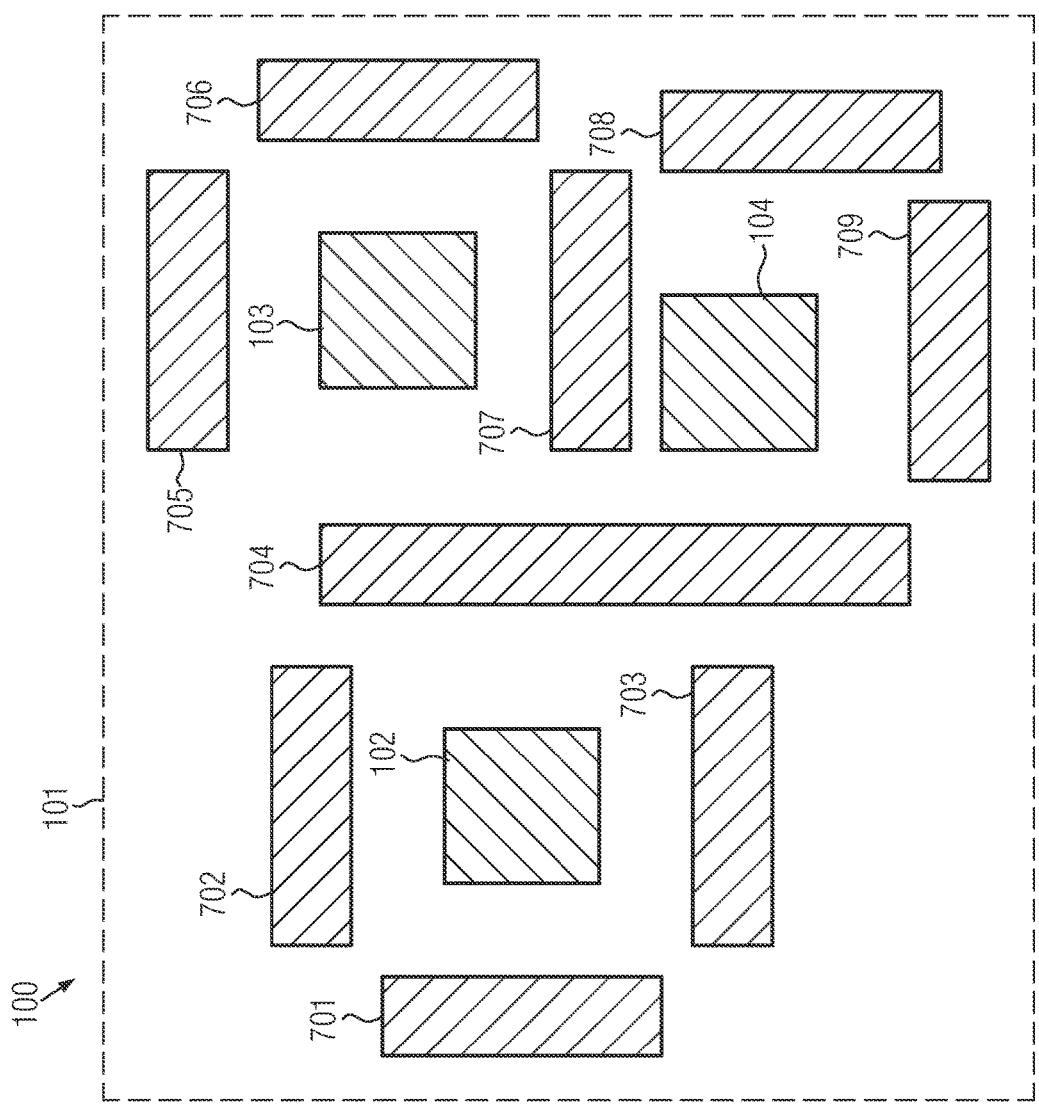
FIG. 7 illustrates another layout of a photomask with SRAFs inserted.

FIG. 7 shows the layout 100, wherein a plurality of SRAFs 701 to 709 are placed in the portion 101 of the photomask. Each of the SRAFs 701 to 709 can have a shape in accordance with one of a set of shapes of SRAFs that are known to be manufacturable by means of techniques for the manufacturing of photomasks. For example, each of the SRAFs 701 to 709 can have an approximately rectangular shape, wherein a length and a width of the rectangular shape can be selected from a set of lengths and widths and/or ranges of lengths and widths of SRAFs that are known to be manufacturable.

For placing the SRAFs 701 to 709 in the layout 100, an arrangement of the SRAFs 701 to 709 can be determined by means of an optimization process wherein an arrangement of SRAFs of shapes that are known to be manufacturable that approximates the arrangement of the subset 501 of the cells of the global grid is determined. This can be done subject to constraints that are provided for ensuring a mask rule compliance of the arrangement of the SRAFs 701 to 709.

In alternative embodiments, the optimization process can be performed on the basis of the values of the global usefulness of the global map 401 rather than on the basis of the subset 501, wherein a priority is given to a placement of SRAFs at positions relative to the portion 101 of the photomask having values of the global SRAF usefulness that indicate that a placement of an SRAF at the respective position is particularly advantageous.

Referring to FIG. 8 again, at 806, a photomask can be manufactured on the basis of the layout 100. The photomask can include the target features 102, 103, 104 and one or more SRAFs, for example the SRAF 601 described above with reference to FIG. 6, or the SRAFs 701 to 709 described above with reference to FIG. 7. This can be done in accordance with known techniques for the manufacturing of photomasks. The photomask can then be used for photolithography processes which can, for example, be performed in the manufacturing of semiconductor structures such as integrated circuits.

The method steps 801 to 806, 901 to 905 and 1001 to 1003 need not be performed in a sequential manner, as shown in FIGS. 8, 9 and 10. In other embodiments, steps of the method can be performed in a parallel manner.

The inventor has performed a comparison of a method as described above with inverse lithography techniques for the creation of a layout of a photomask. A creation of guidelines for the placement of SRAF elements by means of techniques as described above can be three or more orders of magnitude faster than a creation of guidelines for the insertion of SRAF elements by means of inverse lithography techniques. Thus, a layout for a photomask for a full chip having SRAFs can be provided by means of methods as described herein without requiring an excessive amount of computing time on state-of-the-art computer systems. Furthermore, a comparison of simulations of photolithography processes wherein photomasks designed by means of techniques as described herein are used with simulations of photolithography processes wherein photomasks created by means of inverse lithography techniques has shown that process windows of photolithography processes wherein photomasks obtained by means of methods as described above can be smaller than process windows of photolithography processes wherein photomasks obtained by means of inverse lithography techniques are employed.

Figure 11:
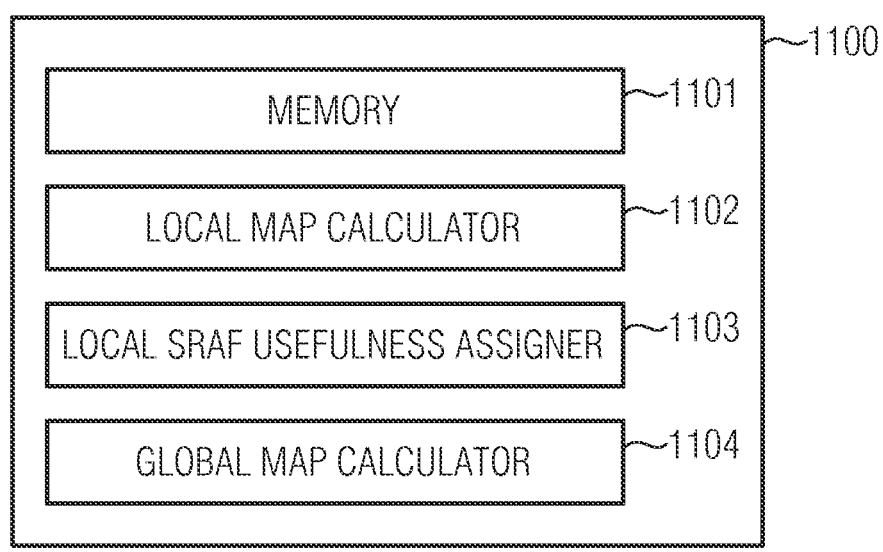
FIG. 11 shows a schematic block diagram of a computer system according to an embodiment.

FIG. 11 shows a schematic block diagram of a computer system 1100 in accordance with an embodiment. The computer system 1100 can include a memory 1101. In the memory 1101, the layout 100 of the photomask can be stored for performing methods as described above. Additionally, the computer system 1100 includes a local map calculator 1102, which can provide the local map 302 for the target shape 201 and, optionally, local maps for other target shapes.

Furthermore, the computer system 1100 can include a local SRAF usefulness assigner 1103, which can provide for each of the target features 102, 103, 104 an assignment of the values of the local SRAF usefulness of the local map 301 for the target shape 201 and/or values of the local SRAF usefulness of local maps for other target shapes to one of a plurality relative to the portion 101 of the photomask, wherein the positions relative to the portion 101 of the photomask can, for example, correspond to the cells of the global grid 402. Additionally, the computer system 1100 can include a global map calculator 1104, which can provide the global map 401.

The local map calculator 1102, the local SRAF usefulness assigner 1103 and the global map calculator 1104 can be provided in form of code that is provided in the memory 1101 of the computer system 1100, and is adapted for causing the computer system 1100 to perform a method as described above. The code can be provided to the computer system 1100 by means of a computer readable storage medium such as a hard disk, an optical disk and/or a solid state storage medium.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method, comprising:
    providing a layout of at least a portion of a photomask in a computer system, the layout comprising a plurality of target features, each target feature having a shape in accordance with a corresponding one of at least one target shape;
    for each of the at least one target shape, providing a local map in the computer system specifying a respective value of a local sub-resolution assist feature (SRAF) usefulness for each of a plurality of positions relative to the target shape, wherein the local SRAF usefulness for a position relative to the target shape is a quantity that is indicative of a change of a process window obtainable in a photolithography process wherein a photoresist is patterned with only the target shape by placing an SRAF element at the position relative to the target shape;
    for each of the plurality of target features, providing an assignment of each of at least a part of the values of the local SRAF usefulness of the local map for the target shape corresponding to the target feature to a respective one of a plurality of positions relative to the at least a portion of a photomask in the computer system;
    providing a global map in the computer system specifying a respective global SRAF usefulness for each of the plurality of positions relative to the at least a portion of the photomask on the basis of the assignment of the values of the local SRAF usefulness, wherein providing the global map comprises calculating, for each of the plurality of positions relative to the at least a portion of the photomask, a value of a function of each of the values of the local SRAF usefulness assigned to the respective position relative to the at least a portion of the photomas; and
    manufacturing a photomask comprising the plurality of target features and the plurality of SRAFs.

2. The method of claim 1, wherein the function comprises a sum of each of the values of the local SRAF usefulness assigned to the respective position relative to the at least a portion of the photomask.

3. The method of claim 2, wherein, in each local map, each of the plurality of positions relative to the target shape corresponds to a cell of a regular local grid of positions.

4. The method of claim 3, wherein each of the plurality of positions relative to the at least a portion of the photomask corresponds to a cell of a regular global grid of positions, wherein a grid spacing of each local grid corresponds to a grid spacing of the global grid.

5. The method of claim 4, wherein, for each of the plurality of target features, providing the assignment of each of at least a part of the values of the local SRAF usefulness of the local map for the target shape corresponding to the target feature to a respective one of a plurality of positions relative to the at least a portion of a photomask comprises:
    determining an offset between the local grid of the local map for the target shape corresponding to the target feature and the global grid on the basis of a position of the target feature relative to the at least a portion of a photomask.

6. The method of claim 5, wherein, for each of the at least one target shape, providing the local map for the target shape comprises:
    performing a first simulation of the photolithography process wherein the photoresist is patterned with only the target shape in the absence of an SRAF element; and
    for each of the plurality of positions relative to the target shape:
        performing a second simulation of the photolithography process wherein the photoresist is patterned with the target shape in the presence of an SRAF element at the position relative to the target shape; and
        determining the value of the local SRAF usefulness for the position relative to the target shape on the basis of a comparison between the second simulation and the first simulation.

7. The method of claim 6, wherein determining the value of the of the local SRAF usefulness for the position relative to the target shape on the basis of a comparison between the second simulation and the first simulation comprises:
    determining a first area under a process window band on the basis of the first simulation;
    determining a second area under a process window band on the basis of the second simulation; and
    calculating a difference between the second area under the process window band and the first area under the process window band as the value of the local SRAF usefulness.

8. The method of claim 7, wherein the first simulation and each second simulation of the photolithography process comprises:
    performing a plurality of simulations runs using different values of one or more parameters of the photolithography process;
    for each of the plurality of simulation runs, determining a contour of a simulated photoresist feature; and
    determining a difference between a maximum area enclosed by the contour of the simulated photoresist feature in the plurality of simulation runs and a minimum area enclosed by the contour of the simulated photoresist feature in the plurality of simulation runs as the area under the process variation band.

9. The method of claim 8, wherein the one or more parameters of the photolithography process include at least one of a focus and a dose.

10. The method of claim 9, further comprising placing one or more SRAFs in the layout on the basis of the global map.

11. The method of claim 10, wherein the placing of one or more SRAFs in the layout on the basis of the global map comprises:
applying a threshold global SRAF usefulness to the global map and selecting a subset of the plurality of positions relative to the at least a portion of the photomask at which the global SRAF usefulness exceeds the threshold global SRAF usefulness.

12. The method of claim 11, wherein the placing of the one or more SRAFs in the layout on the basis of the global map further comprises:
approximating the selected subset of the plurality of positions by means of a plurality of substantially rectangular SRAF elements.

13. The method of claim 12, further comprising manufacturing a photomask comprising the plurality of target features and the plurality of SRAFs.

14. The method of claim 11, wherein the placing of the plurality of SRAFs in the layout on the basis of the global map comprises:
using the subset of the plurality of portions relative to the at least a portion of the photomask as a guidance for an insertion of the one or more SRAFs.

15. A method, comprising:
providing a layout of at least a portion of a photomask in a computer system, the layout comprising a plurality of target features, each target feature having a shape in accordance with a corresponding one of at least one target shape;
for each of the at least one target shape, providing a local map in the computer system specifying a respective value of a local sub-resolution assist feature (SRAF) usefulness for each of a plurality of positions relative to the target shape, wherein the local SRAF usefulness for a position relative to the target shape is a quantity that is indicative of a change of a process window obtainable in a photolithography process wherein a photoresist is patterned with only the target shape by placing an SRAF element at the position relative to the target shape;
for each of the plurality of target features, providing an assignment of each of at least a part of the values of the local SRAF usefulness of the local map for the target shape corresponding to the target feature to a respective one of a plurality of positions relative to the at least a portion of a photomask in the computer system;
providing a global map in the computer system specifying a respective global SRAF usefulness for each of the plurality of positions relative to the at least a portion of the photomask on the basis of the assignment of the values of the local SRAF usefulness, wherein providing the global map comprises calculating, for each of the plurality of positions relative to the at least a portion of the photomask, a sum of the values of the local SRAF usefulness assigned to the respective position relative to the at least a portion of the photomask;
placing one or more SRAFs in the layout on the basis of the global map; and
manufacturing a photomask comprising the plurality of target features and the plurality of SRAFs.

* * * * *

UNITED STATES PATENT AND TRADEMARK OFFICE
CERTIFICATE OF CORRECTION

PATENT NO. : 9,754,068 B2
APPLICATION NO. : 14/684782
DATED : September 5, 2017
INVENTOR(S) : Andrey Lutich Page 1 of 1

It is certified that error appears in the above-identified patent and that said Letters Patent is hereby corrected as shown below:

In the Claims

Column 18, Line 3, change "photomas" to -- photomask --.

Signed and Sealed this
Twenty-fourth Day of October, 2017

Joseph Matal
*Performing the Functions and Duties of the
Under Secretary of Commerce for Intellectual Property and
Director of the United States Patent and Trademark Office*